United States Patent
Frigiere et al.

(10) Patent No.: US 8,711,550 B2
(45) Date of Patent: Apr. 29, 2014

(54) COOLING METHOD AND DEVICE FOR COOLING A MEDIUM-VOLTAGE ELECTRICAL INSTALLATION IN A PROTECTIVE SHEATH

(75) Inventors: Denis Frigiere, Decines (FR); Didier Rodrigues, Serpaize (FR); Jean-Marc Willieme, La Mulatiere (FR); Frank Jacquier, Mions (FR)

(73) Assignee: Alstom Technology Ltd, Baden (CH)

( * ) Notice: Subject to any disclaimer, the term of this patent is extended or adjusted under 35 U.S.C. 154(b) by 106 days.

(21) Appl. No.: 13/502,414

(22) PCT Filed: Oct. 25, 2010

(86) PCT No.: PCT/EP2010/066010
§ 371 (c)(1),
(2), (4) Date: Apr. 17, 2012

(87) PCT Pub. No.: WO2011/051195
PCT Pub. Date: May 5, 2011

(65) Prior Publication Data
US 2012/0199322 A1   Aug. 9, 2012

(30) Foreign Application Priority Data
Oct. 26, 2009 (FR) .................................. 09 57480

(51) Int. Cl.
*H02B 1/00* (2006.01)
(52) U.S. Cl.
USPC ........................................................ 361/677
(58) Field of Classification Search
USPC ........................................................ 361/677
See application file for complete search history.

(56) References Cited

U.S. PATENT DOCUMENTS

| | | | | |
|---|---|---|---|---|
| 3,609,206 A | * | 9/1971 | McConnell | 174/15.6 |
| 3,662,137 A |   | 5/1972 | Cleaveland | |
| 3,769,551 A | * | 10/1973 | Corman et al. | 361/676 |
| 4,005,297 A | * | 1/1977 | Cleaveland | 218/118 |
| 4,650,939 A | * | 3/1987 | Milianowicz | 218/118 |
| 7,253,379 B2 | * | 8/2007 | Lakner et al. | 219/494 |
| 8,081,464 B2 | * | 12/2011 | Mauroux et al. | 361/703 |
| 8,243,453 B2 | * | 8/2012 | Van Dijk et al. | 361/713 |
| 8,426,730 B2 | * | 4/2013 | Widmer et al. | 174/15.5 |
| 2005/0007742 A1 | * | 1/2005 | Pleines et al. | 361/704 |
| 2006/0102618 A1 |   | 5/2006 | Lakner et al. | |
| 2007/0209790 A1 |   | 9/2007 | Kiefer et al. | |

FOREIGN PATENT DOCUMENTS

| | | |
|---|---|---|
| DE | 29 00 761 A1 | 7/1980 |
| DE | 39 41 388 A1 | 6/1991 |
| EP | 1 657 731 A1 | 5/2006 |

OTHER PUBLICATIONS

U.S. Appl. No. 13/502,454, filed Apr. 17, 2012, Frigiere, et al.
U.S. Appl. No. 13/502,421, filed Apr. 17, 2012, Frigiere, et al.
U.S. Appl. No. 13/502,440, filed Apr. 17, 2012, Frigiere, et al.
International Search Report issued Jan. 25, 2011 in PCT/EP2010/066010.

* cited by examiner

*Primary Examiner* — Gregory Thompson
(74) *Attorney, Agent, or Firm* — Oblon, Spivak, McClelland, Maier & Neustadt, L.L.P.

(57) ABSTRACT

A device including a phase-change heat-transfer fluid cooling mechanism to cool a sheath in which is placed switchgear such as a circuit breaker. An evaporator is thus created which is connected to condensers that are placed on a roof of the sheath. The device can be for application to a medium-voltage high-current electrical installation. The device requires little maintenance and only consumes a reduced amount of energy, or even no energy.

12 Claims, 4 Drawing Sheets

COOLING METHOD AND DEVICE FOR COOLING A MEDIUM-VOLTAGE ELECTRICAL INSTALLATION IN A PROTECTIVE SHEATH

FIELD OF THE INVENTION

The invention relates in particular to the field of circuit breakers or disconnectors for medium-voltage generators, placed in a protective sheath, and using cooling devices called "heat pipes" that operate with a phase-change heat-transfer fluid.

It should be recalled that a heat pipe is presented in the form of a long hermetically-sealed enclosure containing a fluid with its gaseous phase and its liquid phase in equilibrium, in the absence of any other gas. In the present example, these fluids may include water, alcohol, and acetone.

PRIOR ART AND PROBLEM POSED

The constant concern of makers of that type of equipment is to increase the ability of such gear to conduct higher and higher currents, in particular for circuit breakers and disconnectors placed inside busbars at the outlets of stations for producing or distributing electricity. That applies particularly for alternator circuit breakers.

A method that is generally used consists in making more uniform the temperature of the air that is in contact with the various heating and heated parts of the circuit breaker concerned. The cooling inside such a protective sheath may take place by natural or forced convection of the air enclosed therein and in which the circuit breaker is immersed, the prevailing temperature inside the protective sheath being considerably higher than the prevailing temperature outside, by 30° C. to at least 40° C. However, the use of such auxiliary appliances, such as fans, presents various drawbacks, which are: high electricity consumption taken from the main circuit, risk of auxiliary fans failing and consequently the need for duplicating them or for providing for degraded operating modes, noise, and considerable bulkiness.

Another solution consists in providing an increase in the current flow section in the various transmission elements, and thus increasing the size of circuit breaker parts.

Figure 1:
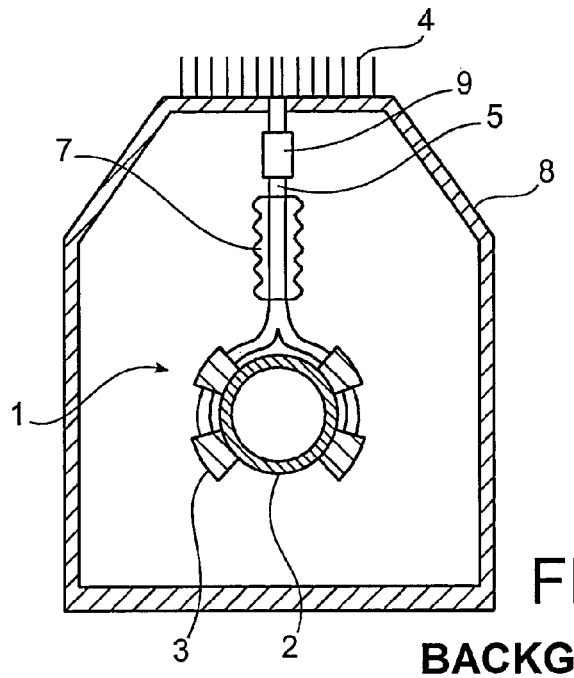

In addition, patent document EP 1 657 731 describes a known cooling device and method for cooling a high-voltage disconnector or a circuit breaker. FIG. 1 shows, in section, an embodiment described in that document. FIG. 1 mainly shows a high-voltage conductor or the casing of a circuit breaker. It is surrounded by evaporators 3 forming part of a cooling assembly 1 therefor. Such an assembly is accompanied by an insulating sleeve 7 surrounding a device operating with a phase-change heat-transfer fluid 5 in order to evacuate the heat collected by the evaporators 3. A flexible sleeve 9 completes the assembly. The various parts are placed together inside a protective sheath 8. The cooling assembly opens out to the top of this protective sheath 8 leading to a condenser device 4, e.g. with fins.

The object of the invention is to propose a different solution for cooling this type of installation.

SUMMARY OF THE INVENTION

The concept of the method and of the device of the invention consists therefore in cooling not just the switchgear concerned and mounted inside a sheath, but also in cooling the sheath itself.

A first main subject of the invention is a cooling method for cooling a medium-voltage, high-current installation for handling and transporting electricity, the installation including current-transporting and current-breaking gear placed in sheaths.

According to the invention, the method consists in cooling the walls of the sheath(s) with cooling elements having a phase-change heat-transfer liquid.

In a first implementation of the method, use is made, for the sheath, of walls of the double-walled type in order to incorporate a portion of the elements having a phase-change heat-transfer fluid.

In a second embodiment of the invention, use is made of heat pipes provided with fins that are placed on the walls of the sheath(s).

In a variant, the cooling means using a heat-transfer liquid are heat pipes that are vertical and that are incorporated in a vertical plate that is pressed against the sheath.

A second subject of the invention is a cooling device for a medium-voltage, high-current installation for handling and transporting electricity, the installation including current-transporting and current-breaking gear placed in sheaths.

In the invention use is made of sheath cooling means for cooling by using phase-change heat-transfer liquid.

In a first embodiment of the device provision is made for the walls of the sheath to be double walls and for the device to consist of elements having a phase-change heat-transfer fluid, each having a portion that is placed in the double walls of the sheath(s) in order to vaporize the heat-transfer liquid, the other portion thereof being connected to condensers.

The condenser(s) is/are then preferably placed on the roof of the sheath.

It is thus advantageous, optionally, to make use of means for providing forced ventilation of the condensers.

A second preferred embodiment of the invention provides for the sheath cooling means to be heat pipes, each having a portion embedded in the sheath wall or in thermal contact with the sheath walls, and for the heat pipes also to be provided with condenser means.

It is then preferable to make the heat-pipe condenser means in the form of fins placed perpendicularly around said heat pipes.

The heat pipes may also be embedded in a vertical plate that is pressed against the sheath.

When a plurality of sheaths are mounted next to one another in parallel, it is advantageous to make use of means for forced ventilation between the sheaths.

LIST OF DRAWINGS

Figure 2A:
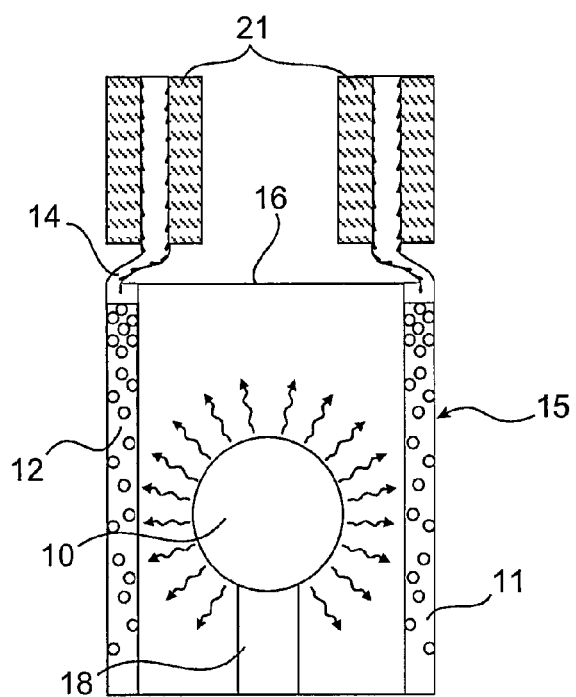
Figure 2B:
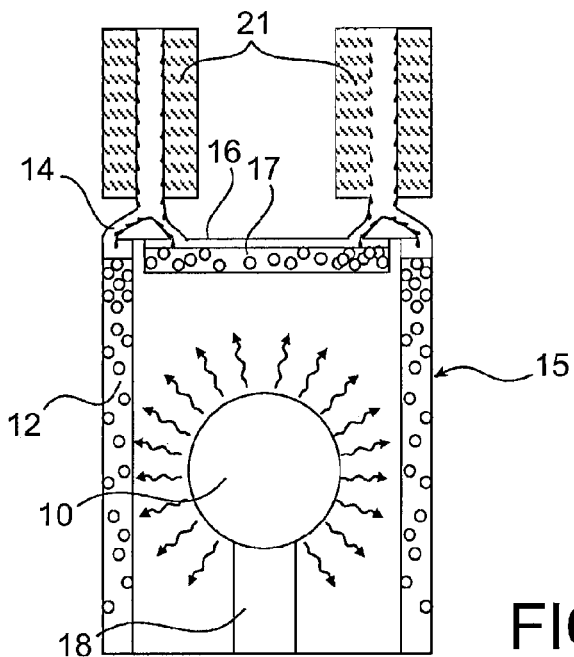
Figure 2C:
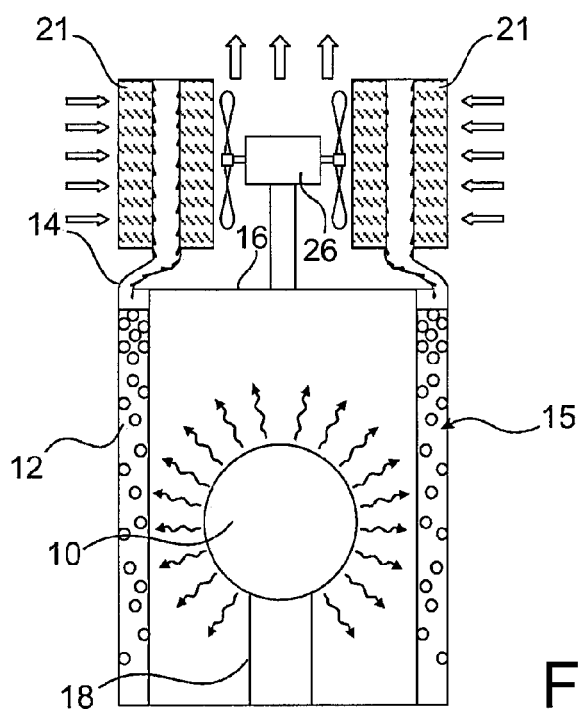
Figure 3A:
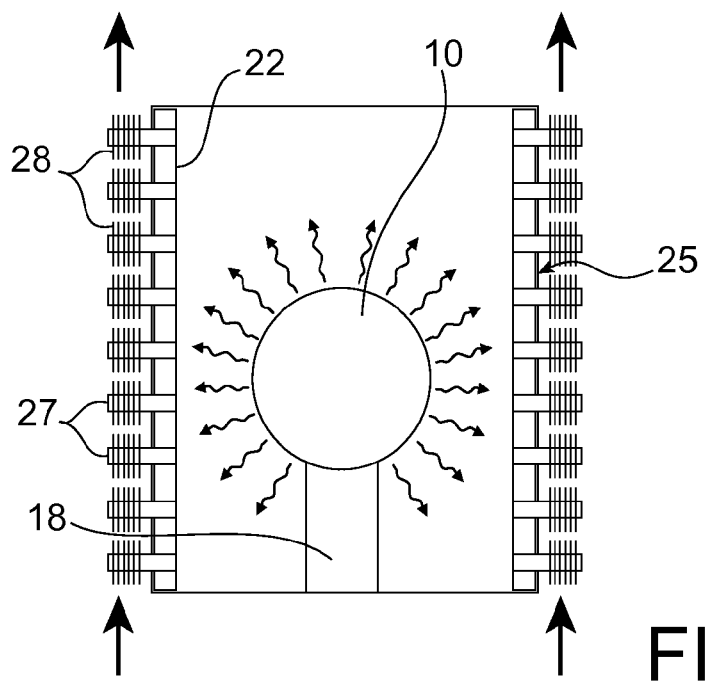
Figure 3B:
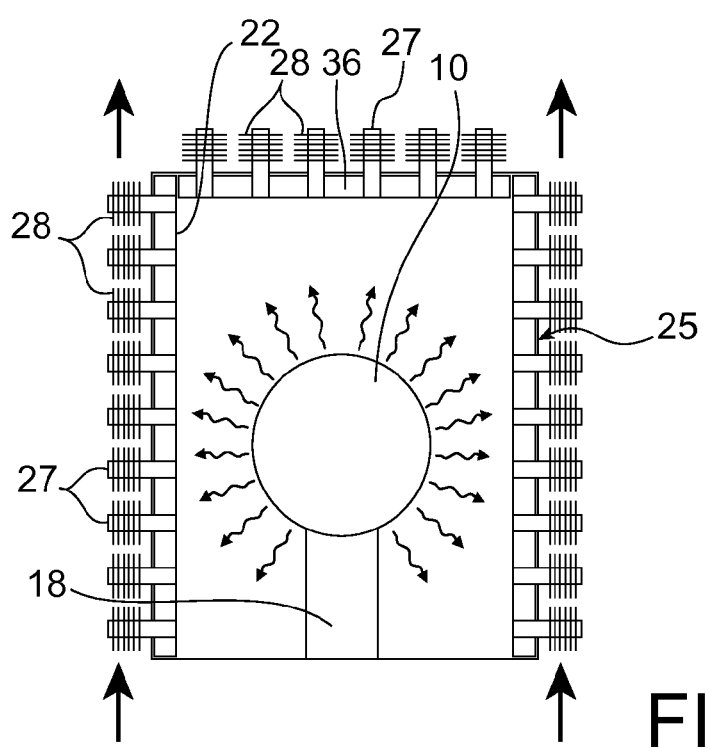
Figure 3C:
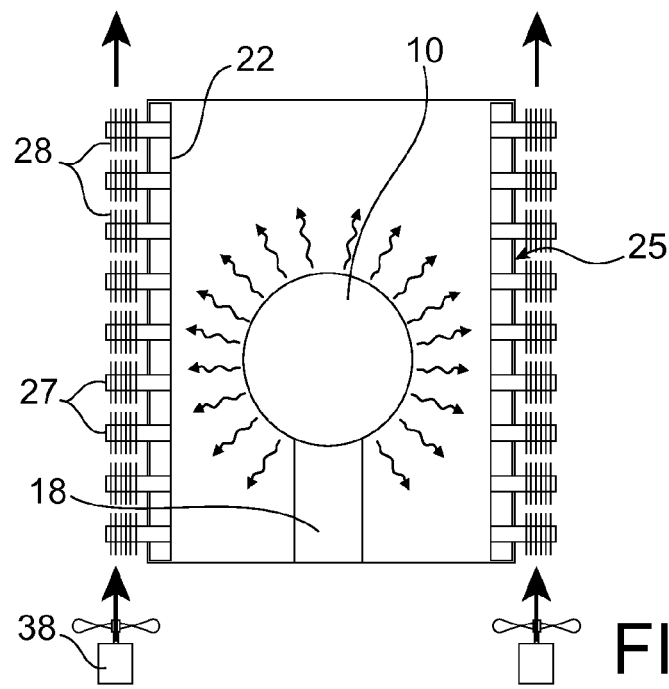
Figure 4:
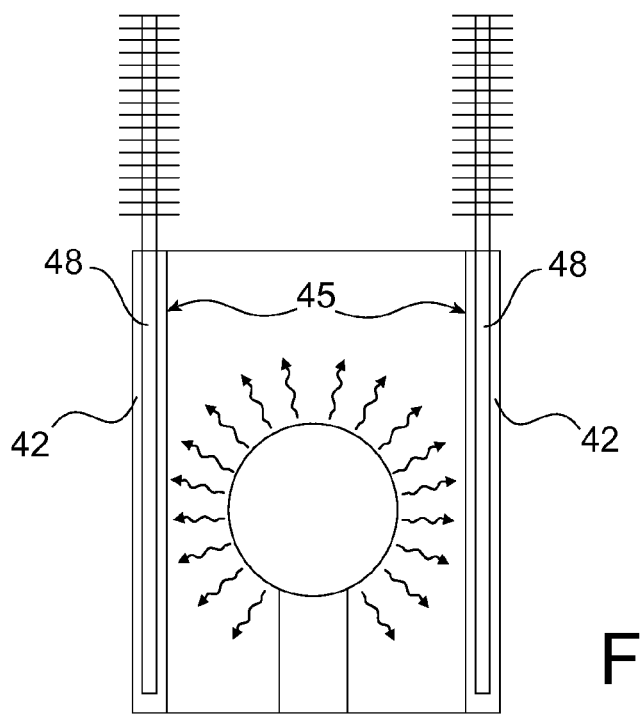

The invention and its various characteristics can be better understood on reading the following description, accompanied by various figures in which, respectively:

FIG. 1, described above, is a cross-section showing a prior art cooling device;

FIGS. 2A, 2B, and 2C are cross-sections showing a first embodiment of the cooling device of the invention;

FIGS. 3A, 3B, and 3C show a second embodiment of the cooling device of the invention; and FIG. 4 is a cross-section showing a third embodiment of the cooling device of the invention.

DETAILED DESCRIPTION OF THE TWO EMBODIMENTS OF THE INVENTION

FIGS. 2A, 2B, and 2C show, in section, the three stages of mounting a generator circuit breaker (GCB). In each of the FIGS. 2A, 2B and 2C, medium voltage switchgear 10, e.g. a circuit breaker, a disconnector or a conductor, is shown, mounted horizontally on an insulating support 18, the different parts all being placed inside a sheath 15. The wavy arrows placed around the switchgear 10 show that said switchgear diffuses a large amount of heat inside the sheath 15.

Provision is made for the sheath 15 to possess side walls 12 that are double walled in such a manner as to enable them to receive evaporators 11 that form part of a cooling system using a phase-change heat-transfer fluid. It should be understood that the side walls 12 of the sheath 15 are therefore heated by the heat given off by the switchgear 10 and can give rise to at least partial evaporation of the fluid contained in the evaporator 11 of the phase-change cooling device. It is pointed out that, in the intended application, the temperature of the side walls 12 of the sheath 15 is about 80° C.

The evaporators 11 placed in the side walls 12 of the sheath 15 are connected, by pipes 14, to condensers 21 that are disposed on the roof 16 of the sheath 15. Thus, these condensers 21 may be swept by the ambient air in the premises in which the electrical installation is located. The heat thus produced by this electrical installation, principally due to the heating of the sheaths 15, is thus evacuated into the atmosphere.

FIG. 2B shows that the roof 16 of the sheath 15 may also be provided with a double wall 18 in which an evaporator 17 may be found that is also connected to a condenser 21 on the roof 16 of the sheath 15. Thus, a maximum amount of heat may be evacuated.

FIG. 2C shows that this installation may be completed by fan means 26 placed between the two condensers 21 that are each placed on a roof 16 of a sheath 15.

A second possible embodiment is shown in FIGS. 3A, 3B, and 3C showing respectively the three stages of mounting a set of busbars or an outlet installation of a power station with a generator circuit breaker (GCB). There can be seen the gear 10 that may still be a circuit breaker, a disconnector or a conductor placed on an insulating support 18. The walls 22 of the sheath 25 in which the gear 10 is found are no longer double-walled structures but are provided with heat pipes 27 each having a portion that is embedded in these walls 22. Each heat pipe 27 may be provided with a certain number of fins 28 that are placed perpendicularly to the heat pipe 27. Thus, the heat accumulated in each side wall 22 of the sheath 25 is distributed in the heat pipe. Ventilation is thus organized along the side walls 22 of the sheaths 25. This convection is natural in FIG. 3A, whereas it is forced in FIG. 3C by vertical fan means 38, and placed next to and below side walls 22 of the sheath under consideration 25. It should be understood that the natural convection between two adjacent sheaths 25 is a favorable factor for the evacuation of the heat given off by the gear 10.

FIG. 3B shows, in the same manner as FIG. 2B, that it is possible also to provide a ceiling 36 of the sheath 25 with heat pipes 27, themselves likewise provided with fins 28.

FIG. 4 shows a variant of the embodiment shown in FIGS. 2A and 2B. The vertical heat pipes 48 are embedded in a vertical plate 42 which is pressed against the wall of the sheath 45. In this embodiment, the vertical plate 42 and the heat pipes 48 are outside the sheath 45, but they could be placed on the inside.

ADVANTAGES OF THE INVENTION

The cooling method of the invention ensures that the system is at no point in contact with the live portions of the electrical installation.

Its energy consumption is limited to no more than the optional use of fan means 26 and 38.

Finally, the only maintenance required by the device of the invention is limited to cleaning the fins 28, when necessary, and even if the gear is live.

The invention claimed is:

1. A cooling method for cooling a medium-voltage, high-current installation for handling and transferring electricity, the installation including current-transporting and current-breaking gear placed in at least one sheath, the method comprising:
   cooling walls of the at least one sheath with cooling elements having a phase-change heat-transfer liquid directly situated in contact with the walls of the at least one sheath.

2. A method according to claim 1, further comprising using the walls of the at least one sheath, which walls are of double-walled type, to incorporate a portion of each of the cooling elements having a phase-change heat-transfer fluid.

3. A method according to claim 1, further comprising using heat pipes that are embedded vertically in a vertical plate that is pressed against the at least one sheath.

4. A method according to claim 1, further comprising using heat pipes that are placed on the walls of the at least one sheath.

5. A cooling device for a medium-voltage, high-current installation for handling and transporting electricity, the installation including current-transporting and current-breaking gear placed in at least one sheath, the device comprising:
   a cooling element of the at least one sheath operating with a phase-change heat-transfer liquid to cool directly the at least one sheath directly situated in contact with the at least one sheath.

6. A device according to claim 5, wherein side walls of the at least one sheath are double walls and evaporators are used that operate with a phase-change heat-transfer liquid, each evaporator including a portion that is placed in the double wall to vaporize the heat-transfer liquid, and another portion thereof being connected to condensers.

7. A device according to claim 6, wherein the condensers are placed on a roof of the at least one sheath.

8. A device according to claim 7, further comprising a fan to provide forced ventilation, and the fan is placed on the roof of the at least one sheath laterally relative to the condensers.

9. A device according to claim 5, wherein the cooling element includes heat pipes, each including a portion embedded in a wall of the at least one sheath, and the heat pipes include a condenser.

10. A device according to claim 9, wherein the condenser includes fins mounted perpendicularly around the heat pipes.

11. A device according to claim 5, wherein the cooling element includes vertical heat pipes embedded in a vertical plate that is pressed against a side wall of the at least one sheath.

12. A device according to claim 9, further comprising a fan to provide forced ventilation to favor upward ventilation between the at least one sheath.

* * * * *